(12) United States Patent
Salih et al.

(10) Patent No.: US 9,214,423 B2
(45) Date of Patent: Dec. 15, 2015

(54) METHOD OF FORMING A HEMT SEMICONDUCTOR DEVICE AND STRUCTURE THEREFOR

(71) Applicant: Semiconductor Components Industries, LLC, Phoenix, AZ (US)

(72) Inventors: Ali Salih, Mesa, AZ (US); Chun-Li Liu, Scottsdale, AZ (US); Gordon M. Grivna, Mesa, AZ (US)

(73) Assignee: SEMICONDUCTOR COMPONENTS INDUSTRIES, LLC, Phoeniz, AZ (US)

( * ) Notice: Subject to any disclaimer, the term of this patent is extended or adjusted under 35 U.S.C. 154(b) by 0 days.

(21) Appl. No.: 14/174,500

(22) Filed: Feb. 6, 2014

(65) Prior Publication Data

US 2014/0264452 A1    Sep. 18, 2014

Related U.S. Application Data

(60) Provisional application No. 61/786,582, filed on Mar. 15, 2013.

(51) Int. Cl.
*H01L 29/49* (2006.01)
*H01L 23/498* (2006.01)
*H01L 29/66* (2006.01)
(Continued)

(52) U.S. Cl.
CPC .... *H01L 23/49827* (2013.01); *H01L 21/76898* (2013.01); *H01L 21/78* (2013.01); *H01L 23/4824* (2013.01); *H01L 24/37* (2013.01); *H01L 24/84* (2013.01); *H01L 29/66462* (2013.01); *H01L 29/7787* (2013.01); *H01L 21/6836* (2013.01); *H01L 24/03* (2013.01); *H01L 24/05* (2013.01); *H01L 24/06* (2013.01); *H01L 24/40* (2013.01); *H01L 24/48* (2013.01); *H01L 29/2003* (2013.01); *H01L 2221/68327* (2013.01); *H01L 2224/0345* (2013.01); *H01L 2224/0346* (2013.01); *H01L 2224/0347* (2013.01); *H01L 2224/04034* (2013.01); *H01L 2224/05111* (2013.01); *H01L 2224/05147* (2013.01); *H01L 2224/05155* (2013.01); *H01L 2224/05166* (2013.01); *H01L 2224/05639* (2013.01); *H01L 2224/05647* (2013.01); *H01L 2224/06181* (2013.01); *H01L 2224/37012* (2013.01); *H01L 2224/37013* (2013.01); *H01L 2224/3716* (2013.01); *H01L 2224/3719* (2013.01); *H01L 2224/37124* (2013.01); *H01L 2224/37147* (2013.01); *H01L 2224/37187* (2013.01); *H01L 2224/37639* (2013.01); *H01L 2224/37644* (2013.01); *H01L 2224/37647* (2013.01); *H01L 2224/37655* (2013.01); *H01L 2224/37664* (2013.01); *H01L 2224/40499* (2013.01); *H01L 2224/84815* (2013.01); *H01L 2924/12032* (2013.01); *H01L 2924/1305* (2013.01); *H01L2924/13064* (2013.01); *H01L 2924/13091* (2013.01)

(58) Field of Classification Search
CPC .............. H01L 21/78; H01L 21/76898; H01L 23/4824; H01L 24/03; H01L 2224/05155
See application file for complete search history.

(56) References Cited

U.S. PATENT DOCUMENTS 7,202,105 B2   4/2007   Carney et al.
7,202,106 B2   4/2007   Carney et al.
(Continued)

*Primary Examiner* — Michael Shingleton
(74) *Attorney, Agent, or Firm* — Robert F. Hightower

(57) ABSTRACT

In one embodiment, a method of forming a HEMT device may include plating a conductor or a plurality of conductors onto an insulator that overlies a plurality of current carrying electrodes of the HEMT device. The method may also include attaching a connector onto the conductor or attaching a plurality of connectors onto the plurality of conductors.

12 Claims, 7 Drawing Sheets

(51) Int. Cl.
  *H01L 29/778* (2006.01)
  *H01L 21/768* (2006.01)
  *H01L 21/78* (2006.01)
  *H01L 23/482* (2006.01)
  H01L 29/20 (2006.01)
  H01L 21/683 (2006.01)
  H01L 23/00 (2006.01)

(56) References Cited

U.S. PATENT DOCUMENTS

| | | |
|---|---|---|
| 7,298,034 B2 | 11/2007 | Carney et al. |
| 7,781,310 B2 | 8/2010 | Grivna |
| 7,989,319 B2 * | 8/2011 | Grivna et al. .............. 438/462 |
| 8,012,857 B2 | 9/2011 | Grivna et al. |
| 2003/0020121 A1 * | 1/2003 | Rockwell et al. ........... 257/378 |
| 2003/0102494 A1 * | 6/2003 | Akamine et al. ........... 257/202 |
| 2006/0081985 A1 * | 4/2006 | Beach et al. ................ 257/745 |
| 2008/0230807 A1 * | 9/2008 | Kuroda et al. .............. 257/197 |
| 2009/0020848 A1 * | 1/2009 | Ono et al. .................... 257/522 |
| 2009/0309212 A1 * | 12/2009 | Shim et al. .................. 257/700 |
| 2010/0201440 A1 * | 8/2010 | Nowak ......................... 327/581 |
| 2011/0266595 A1 * | 11/2011 | Hata ............................ 257/190 |
| 2012/0038058 A1 | 2/2012 | Daumiller et al. |
| 2012/0244681 A1 | 9/2012 | Grivna et al. |

* cited by examiner

METHOD OF FORMING A HEMT SEMICONDUCTOR DEVICE AND STRUCTURE THEREFOR

PRIORITY CLAIM TO PRIOR PROVISIONAL FILING

This application claims priority to prior filed Provisional Application No. 61/786,582 entitled "GaN SEMICONDUCTOR DEVICES AND METHODS THEREFOR" filed on Mar. 15, 2013, and having common inventors Ali Salih et al. which is hereby incorporated herein by reference.

BACKGROUND OF THE INVENTION

The present invention relates, in general, to electronics, and more particularly, to semiconductors, structures thereof, and methods of forming semiconductor devices.

In the past, the semiconductor industry utilized various different device structures and methods to form semiconductor devices that used gallium nitride (GaN) as one of the semiconductor materials.

One problem with these prior structures and devices was that external connection points usually had to be formed outside the area of the die that included active regions of the devices or structures formed on the die.

This usually caused the die size to increase which also increased the cost of the devices and structures.

Accordingly, it is desirable to have a semiconductor device using GaN or other III-nitride series or III-series materials or other compound semiconductor materials that has a smaller die size and a reduced cost.

Figure 1:
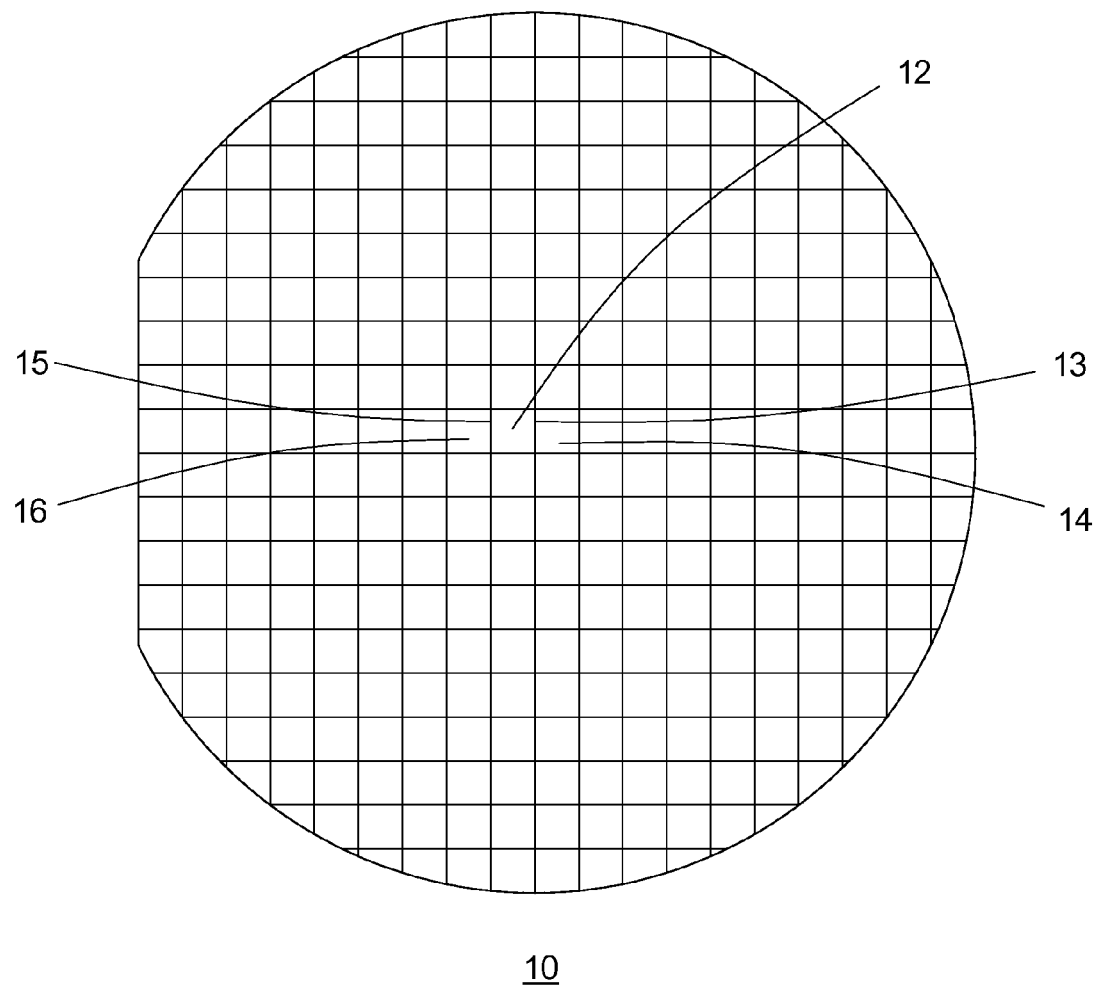
FIG. 1 is a reduced plan view graphically illustrating, in a general manner, an example of an embodiment of a semiconductor wafer that has a plurality of semiconductor die in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements are omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control electrode or control element means an element of the device that controls current through the device such as a gate of an MOS transistor or a base of a bipolar transistor. Although the devices are explained herein as including certain Gallium nitride (GaN) or aluminum gallium nitride (ALGaN) devices, those skilled in the art will appreciate that the devices may include other compound semiconductor material in addition to or instead of GaN and/or ALGaN such as compounds of other III-V or II-VI elements. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description illustrates a cellular design (where the body regions are a plurality of cellular regions) instead of a single body design (where the body region is comprised of a single region formed in an elongated pattern, typically in a serpentine pattern). However, it is intended that the description is applicable to both a cellular implementation and a single base implementation.

DETAILED DESCRIPTION OF THE DRAWINGS

FIG. 1 graphically illustrates, in a general manner, a reduced plan view of an example of an embodiment of a semiconductor wafer 10 that has a plurality of semiconductor die, such as die 12, 14, and 16, formed on semiconductor wafer 10. Die 12, 14, and 16 are spaced apart from each other on wafer 10 by spaces in which singulation openings are to be formed, such as for example as illustrated by singulation lines 13 and 15 which represent where the singulation openings may be formed. As is well known in the art, the plurality of semiconductor die generally are separated from each other on all sides by singulation regions where the singulation openings are to be formed. Those skilled in the art will also appreciate that lines 15 and 15 are not actual lines on wafer 10 or openings in the wafer but are illustrative of a portion of spaces between die 12, 14, and 16 where the openings are to be formed and that some of the portions of wafer 10 in the areas illustrated by lines 13 and 15 are singulation regions that may be removed in order to assist in singulating or removing one or more of die 12, 14, and 16 from wafer 10.

Figure 2:
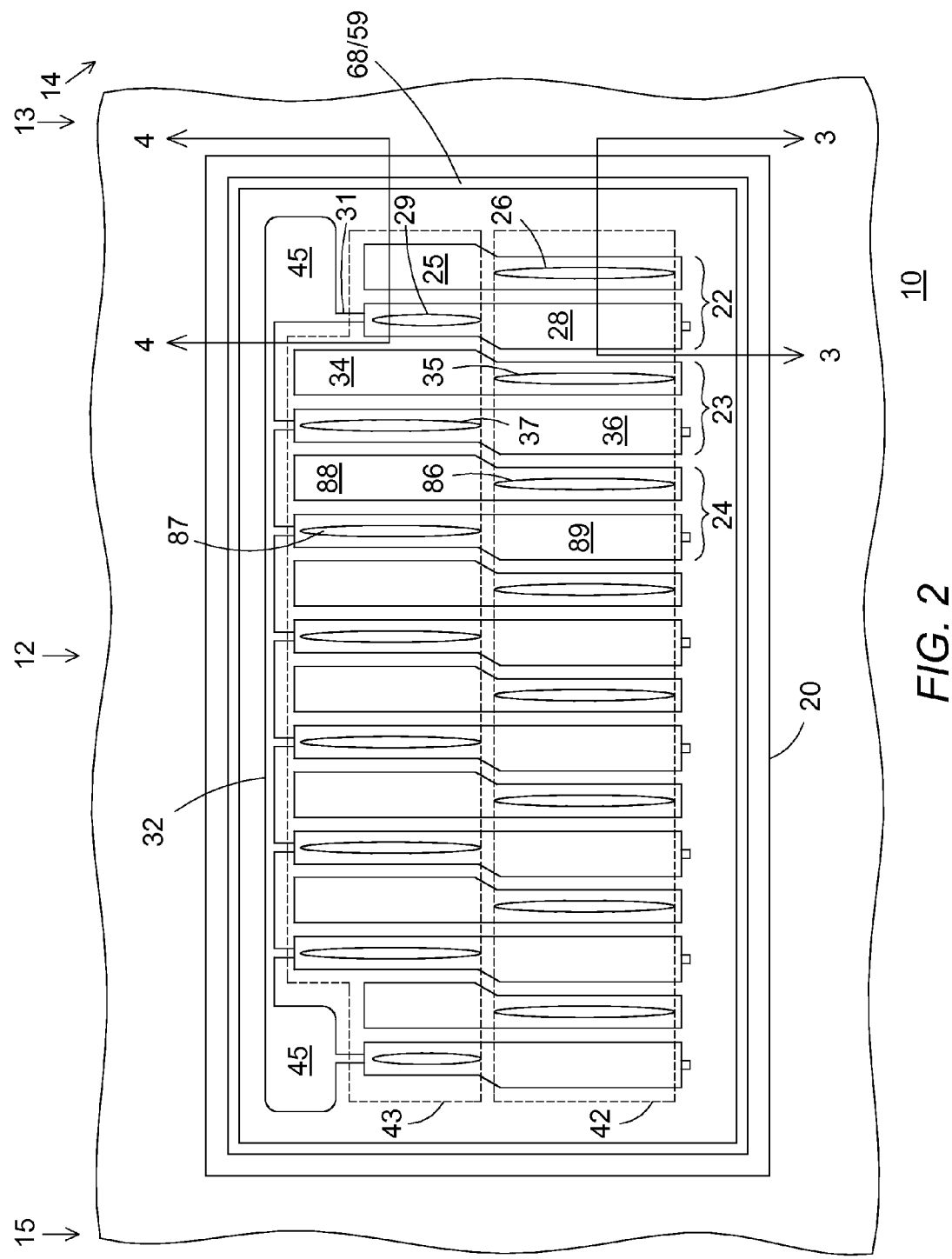
FIG. 2 illustrates an enlarged plan view of an example of an embodiment of a portion of a semiconductor die the semiconductor wafer of FIG. 1 in accordance with the present invention.

FIG. 2 illustrates an enlarged plan view of an example of an embodiment of a portion of wafer 10 that includes die 12 and at least portions of the singulation regions illustrated by singulation lines 13 and 15. Die 12 includes structures that assist in providing increased number of die on wafer 10 thereby improving costs and is formed by methods that assist in providing the increase number of die per wafer. In one embodiment, die 12 may be a HEMT semiconductor device that has a cell based structure with via structures to provide electrical connections to a plurality of the cells, thus, multiple via structures for die 12. In one non-limiting example embodiment, die 12 may be a HEMT transistor 20 but may be other types of devices in other embodiments, such as a diode, a Schottky diode, a MESFET, or other type of HEMT device that assists in providing increased number of die on wafer 10 thereby improving costs. Transistor 20 includes a plurality of cells such as cells 22-24 that each may function as an individual transistor and that may be interconnected together to form transistor 20 in one region of die 12, such as for example a region surrounded by an isolation region 59 (see FIG. 3) formed in substrate 50. Those skilled in the art will appreciate that other devices may be formed on die 12 such as for example outside of the isolated area formed by region 59. As will be seen further hereinafter, each cell includes an active region that has a source region, a drain region, and a gate region. Cells 22, 23, and 24 include a source region that has respective source via structures 29, 37, and 87 that extend into die 12 to form an electrical connection to the source region of the respective cells. Cells 22, 23, and 24 also include drain regions that have respective drain via structures 26, 35, and 86 that extend into die 12 to form an electrical connection to the drain regions of the respective cells. In an embodiment, each of cells 22-24 have a gate electrode or gate conductor 31 that is positioned between the source and drain elements of the respective cells. A drain conductor 42 of transistor 20 extends overlying at least a portion of the surface of die 12 and electrically connects to the drain via structures of each cell such as to via structures 26, 35, and 86 of cells 22-24. A source conductor 43 of transistor 20 extends overlying at least a portion, for example a different portion, of the surface of die 12 and electrically connects to the source via structures of each cell such as to via structures 29, 37, and 87 of cells 22-24. The plurality of drain via structures may be offset from the plurality of source via structures, such as the offset between structures 26 and 29, to assist in minimizing the area of die 12 used for the cells of transistor 20. For example, the plurality of drain structures may extend in a line along the surface of substrate 50 and the plurality of drain structures may extend in another line that is spaced apart from and does not intersect with the line of the plurality of drain structures. The offset facilitates forming conductor 42 to extend laterally across a portion of the surface of the substrate of die 12 to connect to the plurality of drain via structures and to facilitate forming conductor 43 to extend laterally across a different portion of the surface of the substrate to connect to the plurality of source via structures. The offset also minimizes the area of die 12 used for the current carrying elements thereby reducing costs. Although conductors 88 and 36 are drawn showing two offset straight line segments, it is understood that these segments could also be drawn as sloped or curved segments and still enable increased packing density or reduced capacitance.

Each of cells 22-24 include a cell source conductor, such as cell source conductors 28, 36, and 89 that are electrically connected to the respective source via structures 29, 37, and 87, and each of cells 22-24 also include a cell drain conductor, such as cell drain conductors 25, 34, and 88 that are electrically connected to the respective drain via structures 26, 35, and 86. In one embodiment, the shape of the cell source conductor may be interleaved with the shape of the cell drain conductor of an adjoining cell. For example, cell source conductor 36 of cell 23 has a first width along a first portion of conductor 36 and a narrower width along a second portion of conductor 36. An embodiment may include that the adjacent cell drain conductor 88 of adjacent cell 24 has a narrow width for the portion that is adjacent the wide portion of conductor 36 and has a wide width for the portion that is adjacent the narrow portion of conductor 36. This interleaving or the adjacent placement allows placing conductors 36 and 88 closer together than if the conductors had the same width along the entire length of the conductors. In one embodiment, an edge of a wide portion of conductor 88 may be substantially aligned to the wide edge of adjacent conductor 36. The reduced area reduces the area of die 12 thereby increasing the number of die on a wafer and thereby reducing costs. Die 12 is illustrated with cell drain conductors 25 and 34 and cell source conductors 28 and 36 not covered with overlying insulators, etc. so that conductors 25 and 28 may be seen. Die 12 is illustrated with conductors 42 and 43 illustrated by dashed lines to show the relationship between conductors 42 and 43 to cells 22-24 and associated conductors 25 and 28.

Each of gate conductors 31 are electrically connected together by a gate interconnect conductor, such as for example a gate interconnect conductor 32. Each of gate conductors 31 may also be connected to a gate pad, such as for example gate pads 45, in order to facilitate forming a connection between the gate of transistor 20 and other elements external to transistor 20, such as for example a connection to a terminal of a package that contains transistor 20. In most embodiments wire bonding or other similar techniques may be used to form connections between pads 45 and other elements external to transistor 20. Gate interconnect conductor 32 may extend across the surface of another portion of die 12 to interconnect all of gate conductors 31 together.

Figure 3:
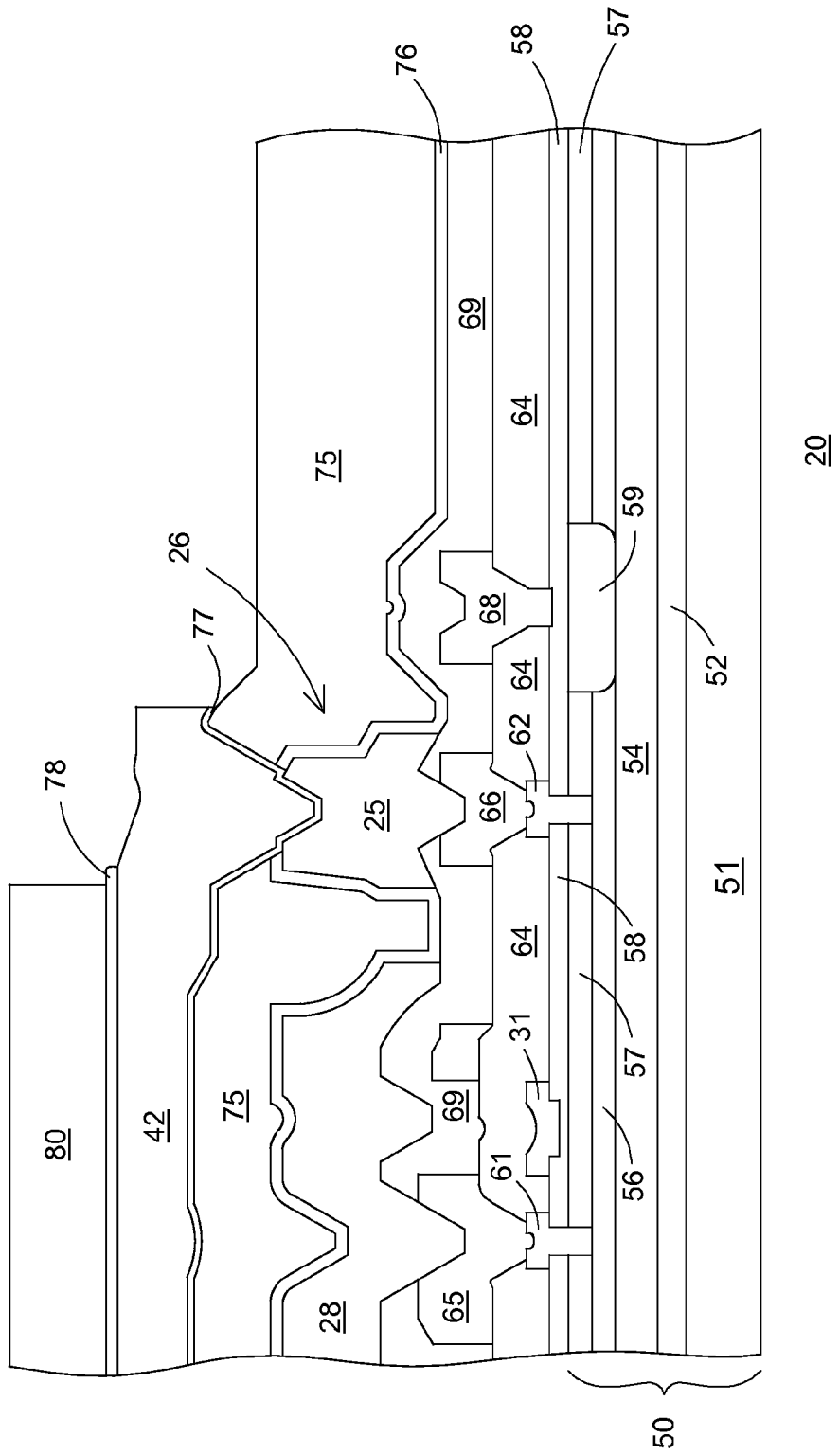
FIG. 3 illustrates an enlarged cross-sectional view of an example of a portion of an embodiment of the semiconductor die of FIG. 2 in accordance with the present invention.

FIG. 3 illustrates an enlarged cross-sectional view of an example of a portion of an embodiment of transistor 20 along cross-section lines 3-3 of FIG. 2.

Figure 4:
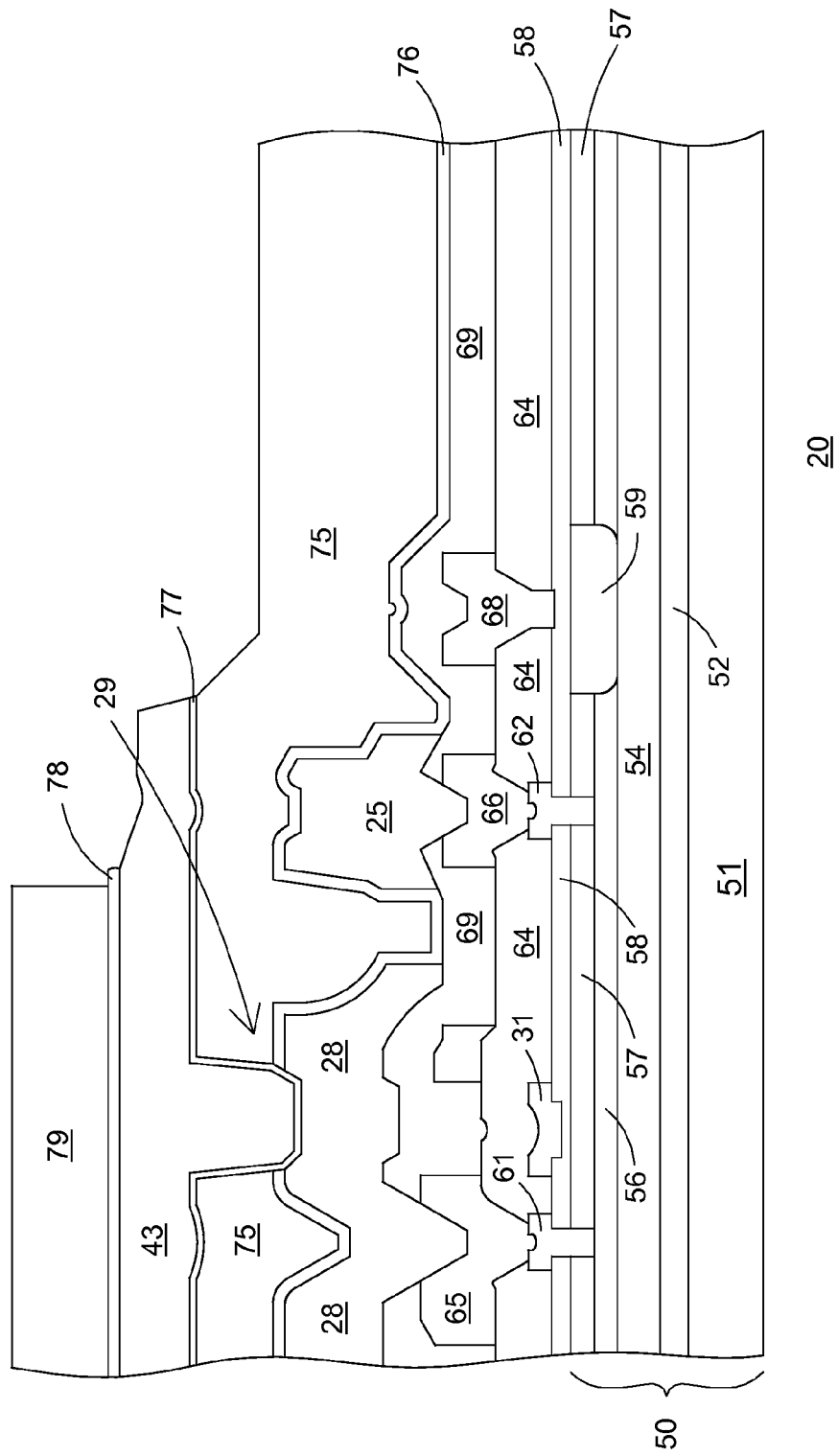
FIG. 4 illustrates an enlarged cross-sectional view of an example of another portion of the semiconductor die of FIG. 2 in accordance with the present invention.

FIG. 4 illustrates an enlarged cross-sectional view of an example of a portion of an embodiment of transistor 20 along cross-section lines 4-4 of FIG. 2. This description has references to FIG. 2-FIG. 4.

Referring to primarily to FIG. 3-FIG. 4, transistor 20 is formed on a substrate 50. Substrate 50 typically includes a plurality of layers. In one embodiment, substrate 50 includes a bulk substrate 51 on which a plurality of semiconductor layers, such as for example a plurality of compound semiconductor layers, are formed overlying substrate 51. Substrate 51 may be one of many different bulk substrates including silicon, silicon carbide, silicon-on-insulator (SOI), ceramic, metal, or various other substrate materials. A preferred embodiment of substrate 51 is a silicon substrate.

An embodiment may include forming an optional nucleation layer 52 on substrate 51. Nucleation layer 52 may include a layer of GaN, or AlGaN, or other compound semiconductor material or some combination thereof. A buffer layer 54 may be formed on layer 52 or on substrate 51 such as if layer 52 is omitted. Buffer layer 54 and layer 52 may be formed as epitaxial layers by known epitaxial formation techniques. In some embodiments, buffer layer 54 serves as a transition layer to reduce strain between the material of substrate 51 and overlying layers of transistor 20. In one example embodiment, buffer layer 54 may include a layer of AlGaN having an Al mole fraction that varies according to the distance from substrate 51, such as for example decreasing for increasing distance from substrate 51. Transistor 20 usually also includes a channel layer 56 overlying buffer layer 54 and a barrier layer 57 overlying channel layer 56. In one embodiment, layers 56 and 57 also may be formed as epitaxial layers. An embodiment includes forming barrier layer 57 as a layer of AlGaN and forming channel layer 56 as a layer of GaN. Those skilled in the art will appreciate that although the described example embodiments include layers of GaN and AlGaN to form a two dimensional electron gas (2DEG) region, such as in channel layer 56, other material may also be used such as other compound semiconductor materials including other III-V and II-VI compound materials such as a layer of Gallium arsenide (GaAs), proximal to a layer of aluminum gallium arsenide (AlGaAs) to assist in forming the 2DEG. In the preferred embodiment, barrier layer 57 is formed on channel layer 56. An optional spacer layer (not shown) may be formed between channel layer 56 and barrier layer 57. An embodiment includes forming the optional spacer layer as a layer of AlN.

At least one insulator or dielectric layer 58 may be formed on or overlying barrier layer 57 to insulate barrier layer 57 from conductors or electrodes used to form source, drain, and/or gate conductors or electrodes, and possibly from other electrical elements or devices external to transistor 20. Insulator 58 may include a plurality of insulator or dielectric layers and different insulator or dielectric materials, such as for example $SiO_X$, $SiO_XN_Y$, $Si_XN_Y$, $Al_XO_Y$, $HFO_X$, $ZRO_X$, and/or others. In one embodiment, openings may be formed through insulator 58 to expose the surface of barrier layer 57 where the source, drain, and gate electrodes are to be formed. An embodiment includes also forming an opening where insolation region 59 and isolation conductor 68 are formed. Isolation region 59 forms a closed structure, such as for example a multiply-connected domain, surrounding a portion of die 12 where the active region of transistor 20 is formed. Region 59 may be formed from a material that minimizes current flow laterally through region 59 in order to minimize leakage current during the operation of transistor 20.

Conductor material may be applied and patterned (or optionally mask patterned) to form a source electrode 61, a drain electrode 62, and a gate electrode 31 electrically and mechanically contacting layer 57. Conductor 68 may also be formed during the formation of electrodes 61, 62, and 31. Those skilled in the art will understand that gate electrode 31 may be formed from a different conductor material and at a different time than electrodes 61 and 62. In another embodiment, a gate insulator (not shown) may be formed on layer 57 and underlying conductor 31 prior to forming conductor 31.

Electrodes 61 and 62 form a first portion of respective via structures 29 and 26. Electrodes 61 and 62 may sometimes be referred to as a first layer conductor or a first layer metal of a multi-layer conductor structure. Those skilled in the art will appreciate that electrodes 61 and 62 may extend across die 12 such as extend out of the plane of the page of FIGS. 3-4 in order to form at least portions of the respective source and drain regions of transistor 20. Those skilled in the art will also appreciate that cells 22-24 may have other shapes instead of the linear elongated shape illustrated in FIG. 2, such as for example a circular shape with the source on an interior of the circle.

In one embodiment via structures 26 and 29 may include multiple other conductor layers that are electrically connected and attached to respective electrodes 62 and 61. For example, after forming electrodes 61 and 62, an insulator 64 may be applied and patterned with openings exposing at least portions of electrodes 61 and 62 where it is desired to form respective structures 29 and 26. The opening for structure 26 may be offset from the opening for structure 29 to assist in minimizing the area of die 12 used for the cells of transistor 20. Thereafter, a conductor material may be applied and patterned within the openings to form conductors 65 and 66 electrically connected to respective electrodes 61 and 62. Conductors 65 and 66 may be formed on electrodes 61 and 62 over the length of electrodes 61 and 62 or may be formed only on the portion of respective electrodes 61 and 62 that are a portion of respective structures 29 and 26. Another insulator 69 may be applied and patterned to expose at least portions of conductors 65 and 66.

Another conductor may be applied and/or patterned to form respective cell drain conductor 25 and cell source conductor 28 electrically connected to respective conductors 66 and 65. Conductors 25 and 28 may be formed on respective conductors 66 and 65 over the length of conductors 66 and 65. A portion of conductor 28 may have a width that laterally overlies electrode 31 in order to form a field plate for the gate of cell 22, thus of transistor 20. An insulator or dielectric 75 may be applied and/or patterned to cover portions of conductors 25 and 28. Insulator 75 typically is formed with openings to expose portions of conductors 25 and 28 where respective structures 26 and 29 are to be formed. Those skilled in the art will appreciate that the portions of electrode 62 and conductors 66 and 25 that underlie the exposed portion of conductor 25 forms via structure 26 (FIG. 3) and that the portions of electrode 61, conductor 65, and conductor 28 that underlie the exposed portion of conductor 28 (FIG. 4) form structure 29. Via structures 26 and 29 may include more or fewer layers of conductors that are vertically connected together instead of the illustrated example of three layers. In one embodiment, insulator 75 may be formed from an organic material such as, for example, polyimide. Using an organic material facilitates forming the surface of insulator 75 that is opposite to substrate 50 to have a smoother surface than a surface of insulators formed by deposition or evaporation. In other embodiments, insulator 75 may be formed from other materials that form a smoothing surface such as for example spin-on-glass (SOG), polybenzoxazole (PBO), or a layer of insulator material that has a surface smoothed by chemo-mechanical polishing (CMP). In some embodiments, an optional layer 76 may be formed between layer 75 and underlying adjacent layers such as conductors 25 and 28, and insulator 69. Layer 76 usually is formed from an insulator material that assists in minimizing charge accumulation on or in layer 75 and leakage that may result therefrom. In an embodiment, optional layer 76 may be a layer of silicon nitride. An embodiment may include that layers 75 and 76 form a dielectric stack such as for example a dielectric stack overlying an inter-layer dielectric such inter-layer dielectric 64 and/or 69.

Subsequently, conductors 42 and 43 may be formed with conductor 42 extending overlying a first portion of the surface of substrate 50 to electrically connect to and/or physically contact at least structures 26, 35, and 86 and with conductor 43 extending overlying a second portion of the surface of substrate 50 to electrically connect to and/or physically contact at least structures 29, 37, and 87. Conductors 42 and 43 may be formed by masking portions of die 12 that do not overlie the via structures and extend between the via structures, and plating a solderable conductor material onto at least the via structures and regions of insulator 75 therebetween. The solderable conductor material may be any conductor material that may be plated onto die 12 and that facilitates soldering another conductor onto the solderable conductor material. An optional seed conductor layer 77 may be applied and/or patterned onto insulator 75 to assist in plating the solderable conductor material onto die 12. Layer 77 may be applied for example by evaporation or sputtering, and conductors 42 and 43 may be plated onto layer 77. In one embodiment, the material for conductors 42 and 43 may be copper or silver or an alloy thereof. The material for layer 77 may be a multiple layers of conductor materials or a multilayer material such as for example a layer of titanium with a layer of copper on the layer of titanium or a layer of titanium, nickel, copper, and tin-silver or other solderable alloy. Forming conductors 42 and 43 by plating provides conductors 42 and 43 with a substantially planar surface on at least portions of a side of the conductors that is opposite to substrate 50. The surface is substantially planar at least for portions of conductor 42 that extends between the via structures, such as extends overlying the surface of substrate 50 between structures 26 and 35, and between structures 35 and 86. The surface is also substantially planar at least for portions of conductor 43 that extends between the via structures, such as extends overlying the surface of substrate 50 between structures 29 and 37, and between structures 37 and 87. In most embodiments, gate pads 45 are formed during the steps of forming any of or several of the conductor material of any of conductors 25, 28, 65, 66, and/or electrodes 61, 62. In most embodiments, gate pads 45 are not plated during the steps of plating conductors 42 and/or 43.

The substantially planar surface assists in attaching a connector onto conductors 42 and/or 43. An attachment material 78 may be utilized to attach the connectors to conductors 42 and/or 43. Those skilled in the art will appreciate that the surface may not be completely planar but that the surface may have small variations that deviate from completely planar such as for example up to approximately sixty percent (60%) of the thickness of material 78. In an embodiment, a clip style conductor connector or connector conductor or connector 79 may be attached onto conductor 42 (FIG. 4), and a clip style connector conductor or connector conductor or connector 80 may be attached onto conductor 43 (FIG. 3). Connectors 79 and 80 may extend past an edge of die 12 so that the distal end of connectors 79 and 80 may be used to form an electrical connection to elements external to die 12. For example, connectors 79 and 80 may be used instead of wire bonding to form an electrical connection between the source and/or drain of die 12 to terminals of a package in which die 12 is housed or the distal ends of connectors 79 and 80 may form the external terminals of the package. Connectors 79 and 80 may be soldered to conductors 42 and 43 by solder re-flow or other well-known soldering techniques. For such an embodiment, material 78 may be a solder attachment material such as for example tin or silver-tin or tin-lead or other solderable attachment material. In another embodiment, connectors 79 and 80 may be attached by a conductive adhesive material such as for example a conductive epoxy or a conductive film. Attaching connectors 79 and 80 by soldering or by an adhesive conductive material minimizes pressure applied to conductors 42 and 43. For example wire bonding to conductors 42 and/or 43 would apply significant force to conductors 42 and/or 43 may damage portions of die 12. Attaching connectors 79 and 80 by soldering or by an adhesive conductive material also eliminates the need for a stiffening layer between insulator 75 and conductors 42 and 43.

In an embodiment, connectors 79 and 80 may be a wide thin strip of conductor material that is attached to conductors 42 and 43. Suitable materials for connectors 79 and 80 include copper, copper alloys, alloy-42, plated copper, copper plated with nickel, plated aluminum, plated plastic, and plated ceramic, for example ceramic that is machined to a shape and plated to provide conductivity. Plating materials include copper, silver, and multi-layer plating materials such as nickel-palladium and gold.

Figure 5:
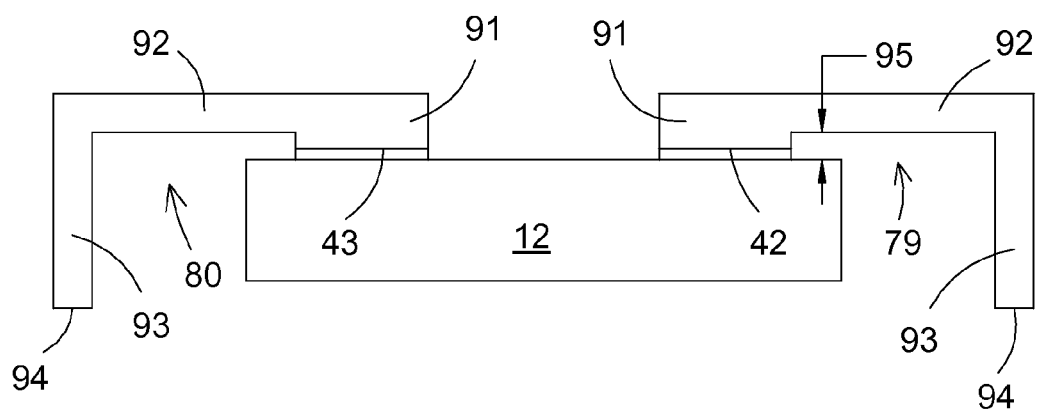
FIG. 5 illustrates in a general manner a cross-sectional view of another example of a portion of the semiconductor die of FIG. 2 in accordance with the present invention.

FIG. 5 illustrates in a general manner a cross-sectional view of an example of a portion of an embodiment of die 12 including example embodiments of portions of connectors 79 and 80. In one non-limiting example embodiment, connectors 79 and/or 80 may include a semiconductor die attachment area or attachment area 91, a connection portion 92, a support portion 93, and a foot 94. Attachment area 91 may be attached to one of conductors 42 or 43 to form the electrically connection to the source or drain of transistor 20. Connection portion 92 may extend laterally to project connector 79 or 80 away from die 12 to facilitate forming a connection to elements external to die 12. In one embodiment, area 91 may extend a distance 95 above the surface of die 12 so that portion 92 does not form a short to die 12. In one embodiment, support portion 93 may extend away from portion 92 to facilitate connecting foot 94 to elements external to die 12. An embodiment may include that portion 93 may be omitted or may be formed to extend at other angles such as for example laterally away from portion 92 or at an angle in a more vertically direction away from portion 92. Those skilled in the art will understand that various other connector embodiments are possible such as those described in U.S. Pat. Nos. 7,202,105, 7,202,106, and 7,298,034 which are hereby incorporated herein by reference.

Those skilled in the art will appreciate that connectors 79 and/or 80 typically are attached to die 12 after die 12 is singulated from wafer 10. Those skilled in the art will understand that compound semiconductor materials typically are brittle and under stress and that singulation techniques such as scribing and breaking, wafer sawing, or laser ablation typically require that the widths of the singulation regions be rather large because portions of the compound semiconductor layers along the singulation regions may crack or chip. The width of singulation regions for such singulation techniques typically are in the range of one hundred twenty microns (120µ). Such wide singulation regions reduce the number of die that may be formed on a wafer thereby increasing costs.

Figure 6:
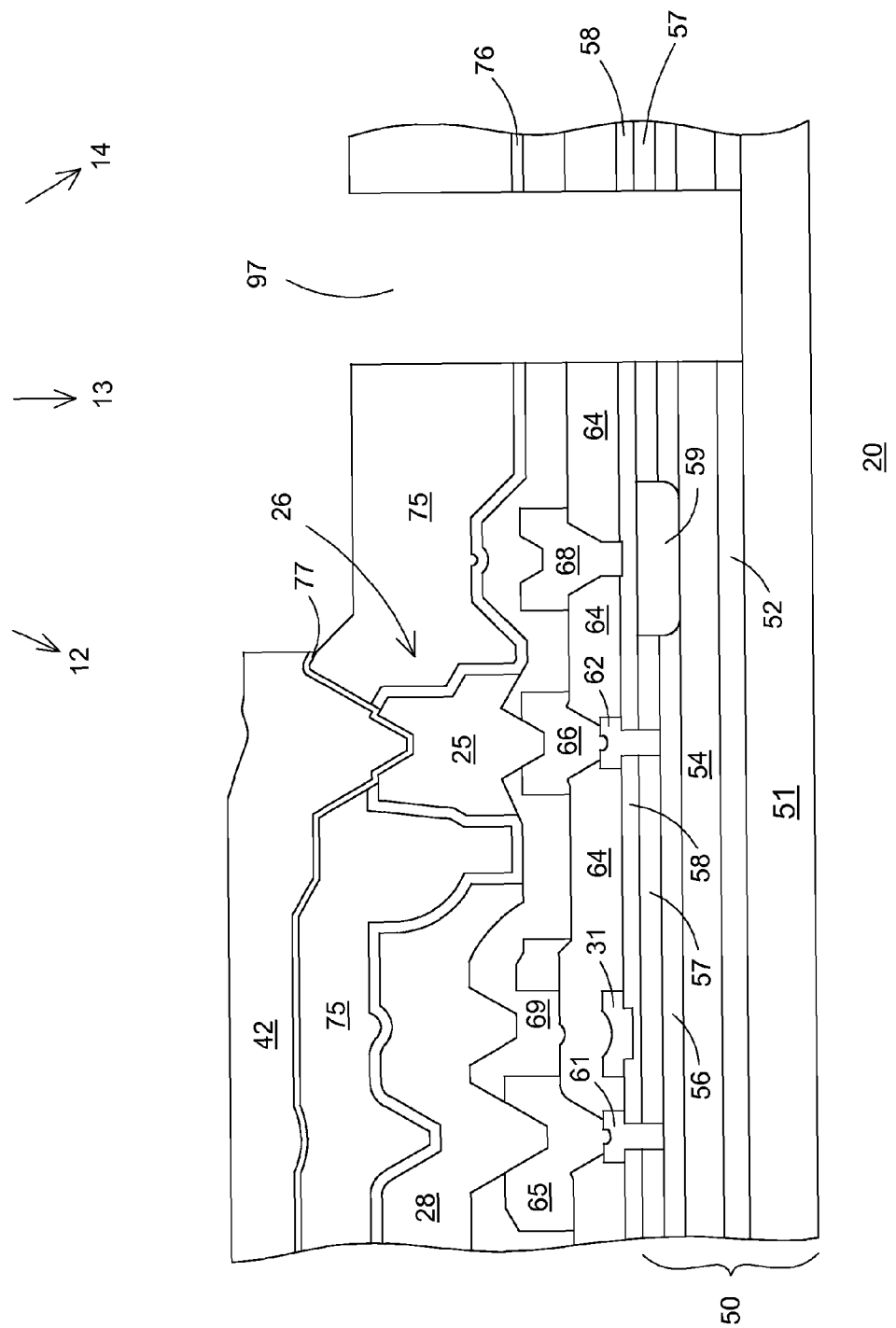
FIG. 6 illustrates examples of portions of the semiconductor die of FIG. 2 according to some steps of a method of singulating the semiconductor die from the wafer of FIG. 1 in accordance with the present invention.

Referring to FIG. 6, die 12 may be singulated from wafer 10, such as prior to attaching connectors 79 and/or 80, using a multi-step dry dicing technique. An opening 97 may be formed in the singulation region, such as where lines 13 and 15 are to be formed, to extend through the compound semiconductor layer and to expose the surface of substrate 51 in the singulation regions, such as line 13. A portion of insulator 75 within the singulation region and underlying portions of insulators and compound semiconductor material layers that are within the singulation region may be removed to expose the surface of an underlying silicon substrate that may be used for substrate 51. A mask may be applied to protect transistor 20 including conductors 42 and 43 and gate pads 45 during such an operation. In one embodiment, a chlorine based plasma may be used to remove layers of materials that overlie the surface of the silicon substrate within the singulation regions. An embodiment may include that a carrier tape may be applied to a surface of substrate 50 or 51 that is opposite to conductors 42 and 43 during the operation of forming 97 and/or extending opening 97. Another embodiment may include forming a conductor on the surface of substrate 50 or 51 that is opposite to conductor 42 and 43 to provide an electrical connection to substrate 50 or 51. Another embodiment may include forming a polymer layer on the surface of substrate 50 or 51 that is opposite to conductor 42 and 43 prior to extending opening 97 through substrate 51. In one embodiment, conductors 42 and 43 may be formed after the step of forming opening 97. In another embodiment, conductors 42 and 43 are formed prior to singulating die 12 from wafer 10 including prior to forming opening 97.

Figure 7:
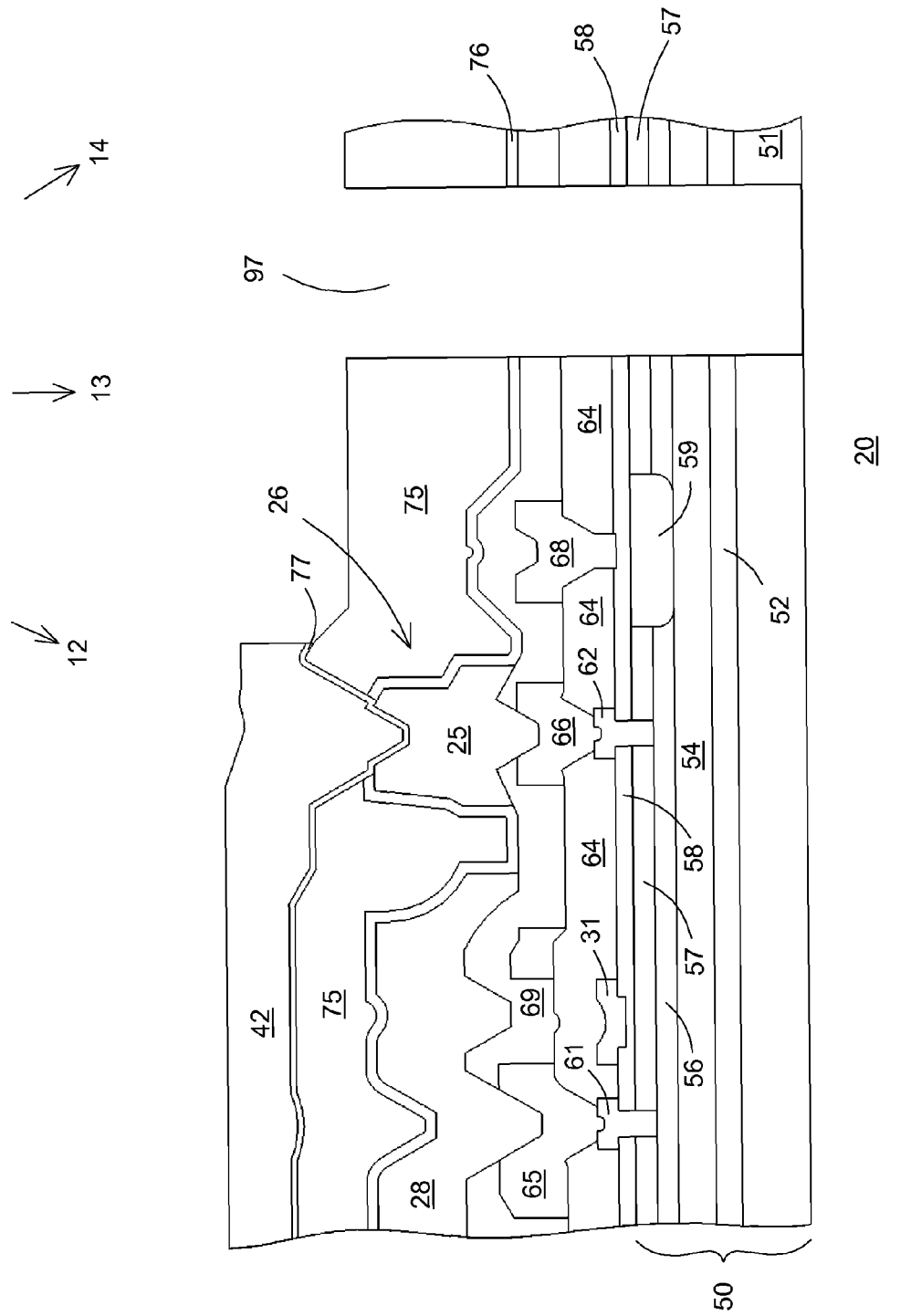
FIG. 7 illustrates examples of portions of the semiconductor die of FIG. 2 according to other steps of a method of singulating the semiconductor die from the wafer of FIG. 1 in accordance with the present invention.

Referring to FIG. 7, the silicon material of substrate 51 within the singulation regions may be removed by increasing the depth of opening 97 to extend through the material of substrate 51. Opening 97 may be extended through substrate 51 by using a plasma etching technique such as those described by U.S. Pat. Nos. 7,781,310, 7,989,319, and 8,012,857, and United States patent publication numbers 2012/0244,681 and 2011/244,657 all of which are incorporated herein by reference. In one embodiment, a fluorine plasma may be used to remove the silicon material of substrate 51 underlying opening 97. An embodiment may include breaking the vacuum between forming the chlorine plasma and forming the fluorine plasmas. In one embodiment, conductors 42 and 43 may be formed after the step of forming opening 97 but prior to extending opening 97 through substrate 51. In one embodiment, the material of conductors 41 and 43 may form a mask to protect other portions of die 12 during the step of extending opening 57 through substrate 51. The width of openings 97 typically are in the range of ten to twenty microns (10-20μ). The decreased width of the singulation openings increases the number of die per wafer thereby reducing costs. Using one type of etchant or one type of plasma chemistry to form opening 97 through the compound semiconductor material and a second type of etchant or type of plasma chemistry for extending the opening through the silicon substrate material reduces breaking and chipping of the die thereby reducing costs.

From all the foregoing, one skilled in the art will appreciate that an embodiment of a HEMT semiconductor device may comprise:

a first plurality of via structures, for example via structures 26/35, overlying a plurality of first current carrying electrodes, for example a drain electrode, of the HEMT semiconductor device, the first plurality of via structures electrically coupled to the plurality of first current carrying electrodes;

a second plurality of via structures, for example via structures 29/37, overlying a plurality of second current carrying electrodes, for example a source electrode, of the HEMT semiconductor device, the second plurality of via structures electrically coupled to the plurality of second current carrying electrodes;

an organic insulator, such as for example insulator 75, overlying at least a portion of the plurality of first and current carrying electrodes wherein the plurality of first and second via structures extend through the organic insulator;

a first conductor, for example conductor 42, extending to electrically contact the first plurality of via structures wherein the first conductor is substantially planar at least in regions between each via structure of the first plurality of via structures and is formed by plating a solderable conductor material onto the HEMT semiconductor device;

a second conductor, such as for example conductor 43, extending to electrically contact the second plurality of via structures wherein the second conductor is substantially planar at least in regions between each via structure of the second plurality of via structures and is formed by plating solderable conductor material onto the HEMT semiconductor device;

a first connector, for example connector 79, attached to the first conductor; and a second connector, for example connector 80, attached to the second conductor.

Another embodiment may include that the first and second connectors are attached to the respective first and second conductors by one of solder or a conductive adhesive.

In an embodiment the organic insulator may be one of polyimide or SOG or PBO.

An embodiment may include that the HEMT semiconductor device may be devoid of a stiffening layer between the organic insulator and the first or second conductors.

Another embodiment may include that the first conductor includes a seed conductor layer formed on the organic insulator and a first conductor material plated onto the seed conductor layer.

An embodiment may include that a width of a first via structure of the first plurality of via structures may increase for increasing distance from a surface of a semiconductor substrate on which the HEMT semiconductor device is formed.

Another embodiment may include that the plurality of first current carrying electrodes may form a drain of a HEMT transistor, the plurality of second current carrying electrodes may form a source of the HEMT transistor, and further including a gate conductor underlying the second conductor and positioned between the source and drain wherein the first and second conductors overlie the gate conductor.

In an embodiment, the first and second connectors may be formed from one of copper, a copper plated material, silver, or a silver plated material.

Another embodiment may include a gate pad configured for wire bonding.

Those skilled in the art will also appreciate that an embodiment of a method of forming a HEMT semiconductor device may comprise:

providing a substrate;

forming a plurality of compound semiconductor layers overlying the substrate;

forming a plurality of first current carrying electrodes, such as for example a plurality of drain electrodes, of the HEMT semiconductor device;

forming a plurality of second current carrying electrodes, for example a plurality of source electrodes, of the HEMT semiconductor device;

forming an insulator overlying the plurality of first and second current carrying electrodes; forming plurality of first via structures, for example via structures 26/35, wherein each first via structure of the plurality of first via structures extends through the insulator and is formed on a corresponding portion of a first current carrying element, such as for example a drain element, of the plurality of first current carrying electrodes;

forming plurality of second via structures, for example via structures 29/37, wherein each second via structure of the plurality of second via structures may extend through the insulator and may be formed on a corresponding portion of a second current carrying element, for example a source elements, of the plurality of second current carrying electrodes;

plating a first conductor, for example conductor 42, to overlie the insulator and to extend laterally overlying a surface of the substrate to electrically contact the plurality of first via structures;

plating a second conductor, for example conductor 43, to overlie the insulator and to extend laterally overlying the surface of the substrate to electrically contact the plurality of second via structures;

attaching a first connector, for example connector 79, to the first conductor; and attaching a second connector, for example connector 80, to the second conductor.

Another embodiment of the method may include plating a solderable conductor to overlie the insulator.

An embodiment may include plating the first conductor to be substantially planar in regions between the plurality of first via structures.

Another embodiment may include plating the second conductor to be substantially planar in regions between the plurality of second via structures.

In an embodiment the method may include forming the insulator devoid of a stiffening layer between the insulator and either of the first and second conductors including forming the insulator as one of polyimide, SOG, or BPO.

Another embodiment may include forming a polyimide layer that is devoid of a stiffening layer between the polyimide layer and either of the first and second conductors.

Those skilled in the art will further appreciate that an embodiment of a method of singulating a HEMT semiconductor die from a semiconductor wafer may comprise:

providing a semiconductor wafer having a silicon substrate;

forming a plurality of semiconductor die on portions of the silicon substrate including forming layers of compound semiconductor material overlying at least portions of the silicon substrate wherein the plurality of semiconductor die are separated from each other by singulation regions of the semiconductor wafer;

forming a first opening through the compound semiconductor material in the singulation regions of the semiconductor wafer and exposing underlying portions of the silicon substrate; and extending the first opening through the silicon substrate exposed within the first opening thereby creating a space between the plurality of semiconductor die.

Another embodiment of the method may include forming the first opening by plasma etching layers of the compound semiconductor material with a plasma of a first chemical composition, and wherein forming the second opening includes subsequently etching the exposed silicon substrate with a plasma of a second chemical composition.

Another embodiment may include using a chlorine based plasma and forming the second chemical composition to include a fluorine based plasma.

In an embodiment, the method may include forming an insulator overlying the layers of compound semiconductor material prior to forming the first opening and further including plating a first conductor overlying the insulator subsequently to forming the first opening and prior to extending the first opening through the silicon substrate.

Another embodiment may include forming an insulator overlying the layers of compound semiconductor material and plating a first conductor overlying the insulator prior to forming the first opening, and forming the first opening through the first conductor and the insulator.

In view of all of the above, it is evident that a novel device and method is disclosed. Included, among other features, is forming via structures of two different current carry elements, such as for example source and drain elements, that are offset from each other to facilitate forming separate continuous conductors for each of the current carry elements. Plating the separate conductors onto an organic insulator facilitates attaching connectors to the conductors by a low pressure attachment method, such as for example by soldering or using an adhesive conductor. In an embodiment, plating the separate conductors onto an organic insulator facilitates forming a substantially planar surface on the conductors which may also facilitate attaching the connectors. The low pressure attachment method reduces pressure and stress applied to the underlying compound semiconductor materials thereby minimizing damage and improving the number of good die per wafer and reducing costs. Using a multi-step plasma etching method to singulate the die from the wafer minimizes damage to the compound semiconductor materials thereby also reducing costs. The multi-step plasma singulation method also minimizes the width of the singulation openings thereby increasing the number of die on a wafer and also reducing costs. Interleaving the cell conductors used for the current carrying elements of each cell of the device also reduces the size of the die thereby also reducing costs.

While the subject matter of the descriptions are described with specific preferred embodiments and example embodiments, the foregoing drawings and descriptions thereof depict only typical and examples of embodiments of the subject matter and are not therefore to be considered to be limiting of its scope, it is evident that many alternatives and variations will be apparent to those skilled in the art. For example, one alternate embodiment may include attaching another device, such as for example a semiconductor device or a passive device, on top of one of or both of conductors 42 and/or 43 or alternately on top of clip 80. A variety of different devices may be attached to conductors 42 and/or 43 or to connector 80 such as for example other semiconductor devices including for example a HEMT or other transistor die, or a diode or passive elements. In an embodiment, clip 80 may then be attached to the another device. Alternately, another clip, similar to clip 80, may then be attached to another device. The subject matter has been described for a particular HEMT transistor structure, although the method is directly applicable to other compound semiconductor devices and other transistor structures.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A method of forming a HEMT semiconductor device comprising:

providing a substrate;

forming a plurality of compound semiconductor layers overlying the substrate;

forming a plurality of first current carrying electrodes on a first current carrying region of the HEMT semiconductor device;

forming a plurality of second current carrying electrodes on a second current carrying region of the HEMT semiconductor device;

forming an insulator overlying the plurality of first and second current carrying electrodes;

forming plurality of first via structures having a first opening wherein each first opening extends through the insulator and is formed overlying a corresponding portion of a first current carrying electrode of the plurality of first current carrying electrodes;

forming plurality of second via structures having a second opening wherein each second opening extends through the insulator and is formed on a corresponding portion of a second current carrying electrode of the plurality of second current carrying electrodes;

plating a first conductor to overlie the insulator and to extend laterally overlying a surface of the substrate to extend into the first opening and electrically contact the plurality of first current carrying electrodes;

plating a second conductor to overlie the insulator and to extend laterally overlying the surface of the substrate to extend into the second opening and electrically contact the plurality of second current carrying electrodes;

attaching a first connector to the first conductor wherein the first connector overlies at least a portion of an active region of the HEMT semiconductor device; and attaching a second connector to the second conductor wherein the second connector overlies at least another portion of the active region of the HEMT semiconductor device.

2. The method of claim 1 wherein plating the first and second conductors to overlie the insulator includes plating a solderable conductor to overlie the insulator.

3. The method of claim 1 wherein plating the first conductor to overlie the insulator includes plating the first conductor to be substantially planar in regions between the plurality of first via structures.

4. The method of claim 3 wherein plating the second conductor to overlie the insulator includes plating the second conductor to be substantially planar in regions between the plurality of second via structures.

5. The method of claim 1 wherein forming the insulator overlying the plurality of first and second current carrying electrodes includes forming the insulator devoid of a stiffening layer between the insulator and either of the first and second conductors including forming the insulator as one of polyimide, SOG, or BPO.

6. The method of claim 1 wherein forming the insulator overlying the plurality of first and second current carrying electrodes includes forming a polyimide layer that is devoid of a stiffening layer between the polyimide layer and either of the first and second conductors.

7. A method of singulating a HEMT semiconductor die from a semiconductor wafer comprising:

providing a semiconductor wafer having a silicon substrate;

forming a plurality of semiconductor die on portions of the silicon substrate including forming layers of compound semiconductor material overlying at least portions of the silicon substrate wherein the plurality of semiconductor die are separated from each other by singulation regions of the semiconductor wafer;

forming a first opening through the compound semiconductor material in the singulation regions of the semiconductor wafer and exposing underlying portions of the silicon substrate; and extending the first opening through the silicon substrate exposed within the first opening thereby creating a space between the plurality of semiconductor die.

8. The method of claim 7 including forming the first opening by plasma etching layers of the compound semiconductor material with a plasma of a first chemical composition, and
wherein extending the first opening includes subsequently etching the exposed silicon substrate with a plasma of a second chemical composition.

9. The method of claim 8 including forming the first chemical composition to include a chlorine based plasma and forming the second chemical composition to include a fluorine based plasma.

10. The method of claim 7 further including forming an insulator overlying the layers of compound semiconductor material prior to forming the first opening and further including plating a first conductor overlying the insulator subsequently to forming the first opening and prior to extending the first opening through the silicon substrate.

11. The method of claim 7 further including forming an insulator overlying the layers of compound semiconductor material and plating a first conductor overlying the insulator prior to forming the first opening, and
forming the first opening through the first conductor and the insulator.

12. The method of claim 1 wherein attaching the first connector includes attaching the first connector having a portion that extends past an edge of the HEMT semiconductor device to form an electrical connection to elements external to the HEMT semiconductor device.

* * * * *